(12) United States Patent
D'Abreu et al.

(10) Patent No.: US 9,117,533 B2
(45) Date of Patent: Aug. 25, 2015

(54) TRACKING ERASE OPERATIONS TO REGIONS OF NON-VOLATILE MEMORY

(71) Applicant: SANDISK TECHNOLOGIES INC., Plano, TX (US)

(72) Inventors: Manuel Antonio D'Abreu, El Dorado Hills, CA (US); Dimitris Pantelakis, Santa Clara, CA (US); Stephen Skala, Fremont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 141 days.

(21) Appl. No.: 13/800,224

(22) Filed: Mar. 13, 2013

(65) Prior Publication Data

US 2014/0269067 A1   Sep. 18, 2014

(51) Int. Cl.
*G11C 16/16* (2006.01)
*G06F 12/02* (2006.01)
*G11C 16/20* (2006.01)
*G11C 16/34* (2006.01)

(52) U.S. Cl.
CPC ............ *G11C 16/16* (2013.01); *G06F 12/0246* (2013.01); *G11C 16/20* (2013.01); *G11C 16/3495* (2013.01)

(58) Field of Classification Search
CPC ....................................................... G11C 16/16
USPC ........................................ 365/185.11, 185.33
See application file for complete search history.

(56) References Cited

U.S. PATENT DOCUMENTS

| 7,200,708 B1* | 4/2007 | Kreifels ........................ 711/103 |
| 7,653,778 B2* | 1/2010 | Merry et al. .................. 711/103 |
| 8,090,899 B1 | 1/2012 | Syu |
| 2006/0149896 A1 | 7/2006 | Chang et al. |
| 2008/0313505 A1 | 12/2008 | Lee et al. |
| 2009/0319859 A1 | 12/2009 | Alrod et al. |
| 2010/0125696 A1 | 5/2010 | Kumar et al. |
| 2010/0162079 A1* | 6/2010 | Hwang ........................ 714/758 |
| 2010/0174852 A1 | 7/2010 | Chien et al. |
| 2011/0131368 A1 | 6/2011 | Lee et al. |
| 2011/0246705 A1 | 10/2011 | Mudama et al. |
| 2011/0302359 A1 | 12/2011 | Schmidberger |
| 2012/0069664 A1 | 3/2012 | Kim et al. |

FOREIGN PATENT DOCUMENTS

WO    2012001556 A1    1/2012

OTHER PUBLICATIONS

International Search Report and Written Opinion of the International Searching Authority (EPO) for International Application No. PCT/US2014/019940, mailed Jul. 11, 2014, 13 pages.

* cited by examiner

*Primary Examiner* — Haoi V Ho
*Assistant Examiner* — Tri Hoang
(74) *Attorney, Agent, or Firm* — Toler Law Group, PC

(57) ABSTRACT

A data storage device includes a memory and a controller and may perform a method that includes updating, in the controller, a value of a particular counter of a set of counters in response to an erase operation to a particular region of the non-volatile memory that is tracked by the particular counter. The method includes, in response to the value of the particular counter indicating that a count of erase operations to the particular region satisfies a first threshold, initiating a remedial action to the particular region of the non-volatile memory.

25 Claims, 3 Drawing Sheets

TRACKING ERASE OPERATIONS TO REGIONS OF NON-VOLATILE MEMORY

FIELD OF THE DISCLOSURE

The present disclosure is generally related to tracking write/erase cycles of non-volatile memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

One source of errors that occur in data stored in a memory device is a result of repeated write/erase (W/E) cycles to the memory device. Cell threshold voltage distributions (CVDs) may shift and broaden with increasing numbers of W/E cycles, resulting in an increasing number of data errors as the memory device ages. Wear leveling techniques may be used to distribute W/E operations so that all regions of the memory are subjected to approximately an equal number of W/E cycles. As a result, wear leveling may extend a useful life of the memory device that may otherwise be limited by a portion of the memory that experiences accelerated wearing due to more frequent erase operations as compared to other portions of the memory.

SUMMARY

Erase operations to regions of a non-volatile memory of a data storage device are tracked by a controller of the data storage device. When a number of erase operations to a particular region satisfies a threshold amount, a remedial action is initiated to the particular region. For example, an erase block in the particular region may be scheduled for non-use or may be flagged for enhanced reliability techniques, such as data-parity interleaving or adaptive reading. Logically partitioning the non-volatile memory into multiple regions enables tracking of W/E cycles of distinct groups of storage elements. The storage elements may be grouped according to anticipated susceptibility to accumulated effects of W/E cycles to different physical characteristics of the storage elements. By implementing remedial action based on each group's exposure to W/E cycles as compared to the group's endurance to W/E cycles, a useful life of the data storage device may be extended.

DETAILED DESCRIPTION

Figure 1:
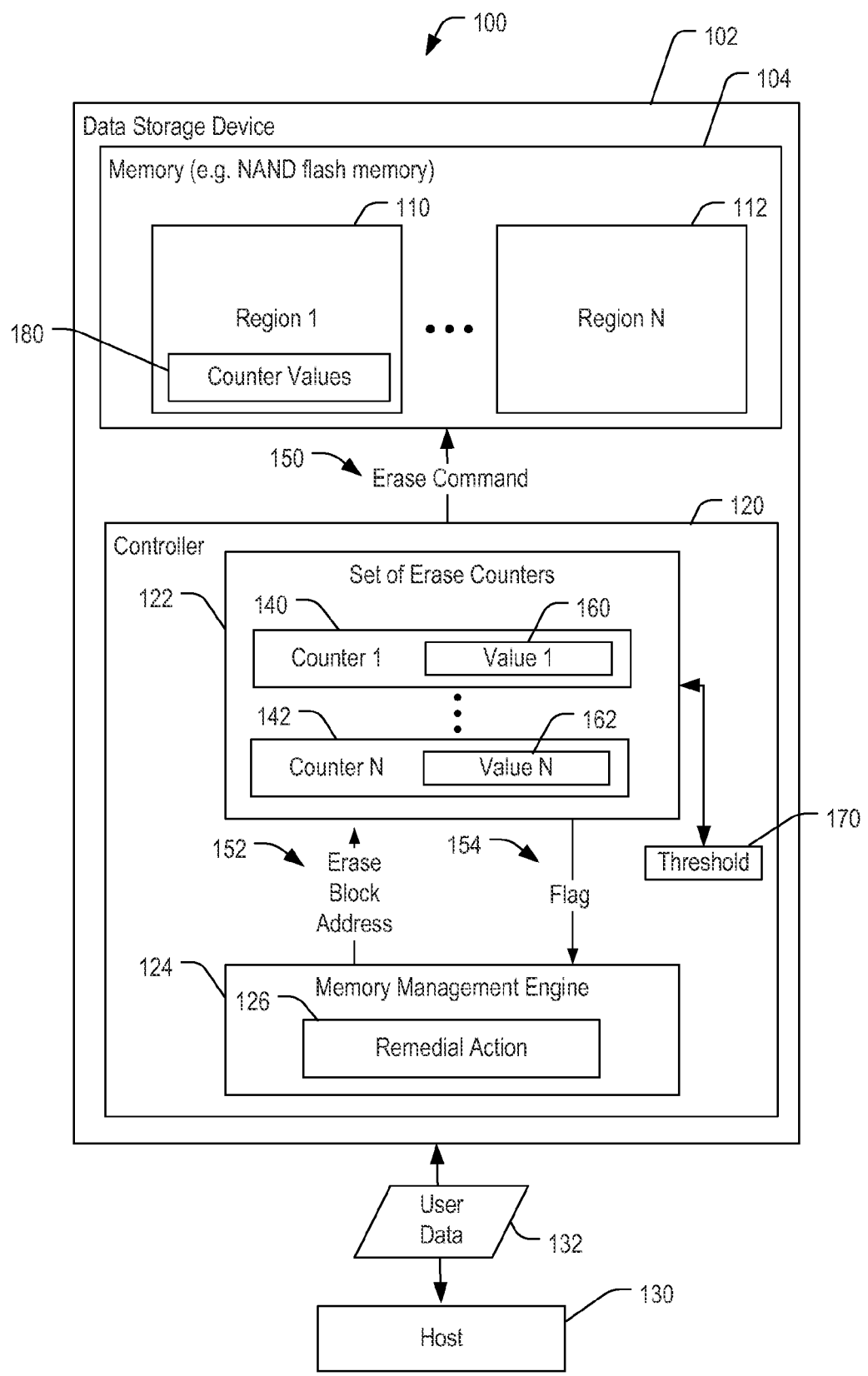
FIG. 1 is a block diagram of a particular illustrative embodiment of a system including a data storage device configured to track erase operations to multiple regions of memory and to initiate a remedial action.

Referring to FIG. 1, a particular embodiment of a system 100 includes a data storage device 102 coupled to a host device 130. The data storage device 102 is configured to track erase operations to multiple regions of a non-volatile memory 104 and to initiate a remedial action based on the tracked erase operations.

The host device 130 may be configured to provide data, such as user data 132, to be stored at the non-volatile memory 104 or to request data to be read from the non-volatile memory 104. For example, the host device 130 may include a mobile telephone, a music or video player, a gaming console, an electronic book reader, a personal digital assistant (PDA), a computer, such as a laptop computer, a notebook computer, or a tablet, solid state storage drive, any other electronic device, or any combination thereof.

The data storage device 102 includes the non-volatile memory 104 coupled to a controller 120. The non-volatile memory 104 may be a flash memory, such as a NAND flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The non-volatile memory 104 includes multiple groups of storage elements, such as word lines of a multi-level cell (MLC) flash memory that includes multiple MLC flash cells. The non-volatile memory 104 may also include multiple blocks of storage elements, such as erase blocks of a flash memory that includes multiple word lines in each erase block. The non-volatile memory 104 is logically partitioned into multiple regions including a first region (region 1) 110 and an Nth region (region N) 112, where N is an integer greater than one. For example, in some implementations the non-volatile memory 104 may be partitioned into two regions (i.e., N equals 2). In other implementations, the non-volatile memory 104 may be partitioned into more than two regions, including the first region 110, one or more other regions (not shown), and the Nth region 112 (i.e., N is greater than 2). Each region 110-112 can include one or more word lines, blocks, or other portions of the non-volatile memory 104. To illustrate, in an implementation where the non-volatile memory 104 includes multiple arrays, multiple planes, multiple dies, or any combination thereof, each region may include multiple word lines or blocks within a single array, plane, or die. As another example, a single region (e.g., the first region 110) may span multiple arrays, planes, or dies, or any combination thereof. To illustrate, the first region 110 may include storage elements within a first die and storage elements within a second die.

The controller 120 is configured to receive data and instructions from and to send data to the host device 130 while the data storage device 102 is operatively coupled to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 may include an ECC engine (not shown) that is configured to receive data to be stored to the non-volatile memory 104 and to generate a codeword. For example, the ECC engine may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode data according to one or more other ECC encoding schemes, or any combination thereof. The ECC engine may include a decoder configured to decode data read from the non-volatile memory 104 to detect and correct, up to an error correction capability of the ECC scheme, bit errors that may be present in the data.

The controller 120 includes a set of counters 122 that are configured to track erase operations performed to the regions 110-112 of the non-volatile memory 104. The set of counters 122 includes multiple counters, including a first counter (counter 1) 140 and an Nth counter (counter N) 142. The first counter 140 has a first value 160 that is updatable by the controller 120 to track memory accesses to the first region 110. The Nth counter 142 has an Nth value 162 that is also updatable by the controller 120 to track memory accesses to the Nth region 112. In an implementation where the non-volatile memory 104 is partitioned into two regions (i.e., N=2), the set of counters 122 may include two counters (i.e., the first counter 140 and the Nth (second) counter 142). In implementations where the non-volatile memory 104 is partitioned into more than two regions (i.e., N>2), the set of counters 122 may include more than two counters (i.e., the first counter 140, one or more additional counters (not shown), and the Nth counter 142). The counters 140-142 may be implemented as data values stored in a random access memory (RAM) that is accessible to the firmware executing controller 120, as an illustrative example.

The controller 120 includes a memory management engine 124. The memory management engine 124 is configured to schedule erase operations of erase blocks that may be identified by an erase block address 152. For example, the erase block address 152 may correspond to a physical address (e.g., an index or other identifier) of an erase block in the non-volatile memory 104. To illustrate, the memory management engine 124 may perform a "garbage collection" operation in which valid data on an erase block is copied to another block, the erase block is erased, and the erased block is added to a list of available blocks to receive new data. The memory management engine 124 is configured to generate an erase command 150 to perform an erase operation at the erase block address 152 of the non-volatile memory 104. In addition, the memory management engine 124 is configured to provide the erase block address 152 to the set of erase counters 122.

In response to determining the erase block address 152 corresponding to a physical address of a block to be erased, the controller 120 may select a particular counter of the set of counters 122 corresponding to a region of the non-volatile memory 104 that is tracked by the particular counter. For example, when the erase block address 152 corresponds to the first region 110, the controller 120 may determine that the first counter 140 maintains a count of erase operations to the first region 110, and as a result the first value 160 may be updated by the first counter 140. As another example, when the erase block address 152 corresponds to a block in the Nth region 112, which is tracked by the Nth counter 142, the Nth value 162 of the Nth counter 142 may be updated to indicate the erase operation.

Each of the values 160-162 that corresponds to counts of erase operations to the particular regions tracked by the corresponding counters 140-142 may be compared to a threshold 170. In response to determining that one or more of the values 160-162 satisfies the threshold 170, a flag 154 may be generated and provided to the memory management engine 124. In some embodiments, such as when the counters 140-142 count up from an initial value, a value satisfies the threshold 170 when the value exceeds the threshold 170. In other embodiments, a value satisfies the threshold 170 when the value is greater than or equal to the threshold 170. Alternatively, in some embodiments, such as when the counters 140-142 count down from an initial value, a value satisfies the threshold 170 when the value is less than the threshold 170. In other embodiments, a value satisfies the threshold 170 when the value is less than or equal to the threshold 170. The memory management engine 124 may receive the flag 154 and may initiate a remedial action 126 to the corresponding region of the non-volatile memory 104.

For example, when the first value 160 indicates that a count of erase operations to the first region 110 satisfies the threshold 170, the controller 120 may be configured to initiate the remedial action 126 to the first region 110. The remedial action 126 may include scheduling one or more erase blocks in the first region 110 to be unused after performing a data move operation that causes data in the one or more erase blocks to be moved to a different memory location of the non-volatile memory 104. As another example, the remedial action 126 may include flagging one or more erase blocks for enhanced reliability techniques. Enhanced reliability techniques may include using a more robust ECC scheme for data to be stored in the one or more erase blocks, such as by increasing a proportion of parity bits to data bits. As another example, the one or more erase blocks may be flagged for interleaving of data and parity across multiple logical pages of a word line. Because different logical pages of a word line may have different reliability, interleaving data and parity across multiple logical pages distributes errors from each logical page across multiple ECC codewords and reduces a probability that an uncorrectable number of errors will be introduced into any single ECC codeword. As another example, the one or more erase blocks may be flagged for dynamic reading that includes reading data by performing multiple sensing operations using multiple read voltages to identify a set of read voltages that corresponds to a fewest number of errors in the data. Potential corruption of data in the non-volatile memory 104 caused by W/E cycling effects may be anticipated based on counts of erase operations to each of the regions 110-112. The remedial action 126 may be performed for one or more of the regions 110-112 to avoid unrecoverable corruption of data resulting from accumulated W/E cycling effects due to multiple erase operations.

In some implementations, the counters 140-142 may count upward from a reset value (e.g., a 0 value) with each erase operation to the region tracked by the particular counter 140-142. The value 160-162 of each counter 140-142 may be compared against the threshold 170 (e.g., each time the value 160-162 is updated) to determine when a number of erase operations to a corresponding region 110-112 of the non-volatile memory 104 satisfies the threshold 170. However, in other implementations, other configurations of the counters 140-142 may be applied. For example, the counters 140-142 may be initially set to a value corresponding to a W/E cycle limit, and the counters 140-142 may decrement the corresponding value 160-162 with each erase operation. When one of the values 160-162 reaches a zero value, the flag 154 may be provided to the memory management engine 124.

Figure 2:
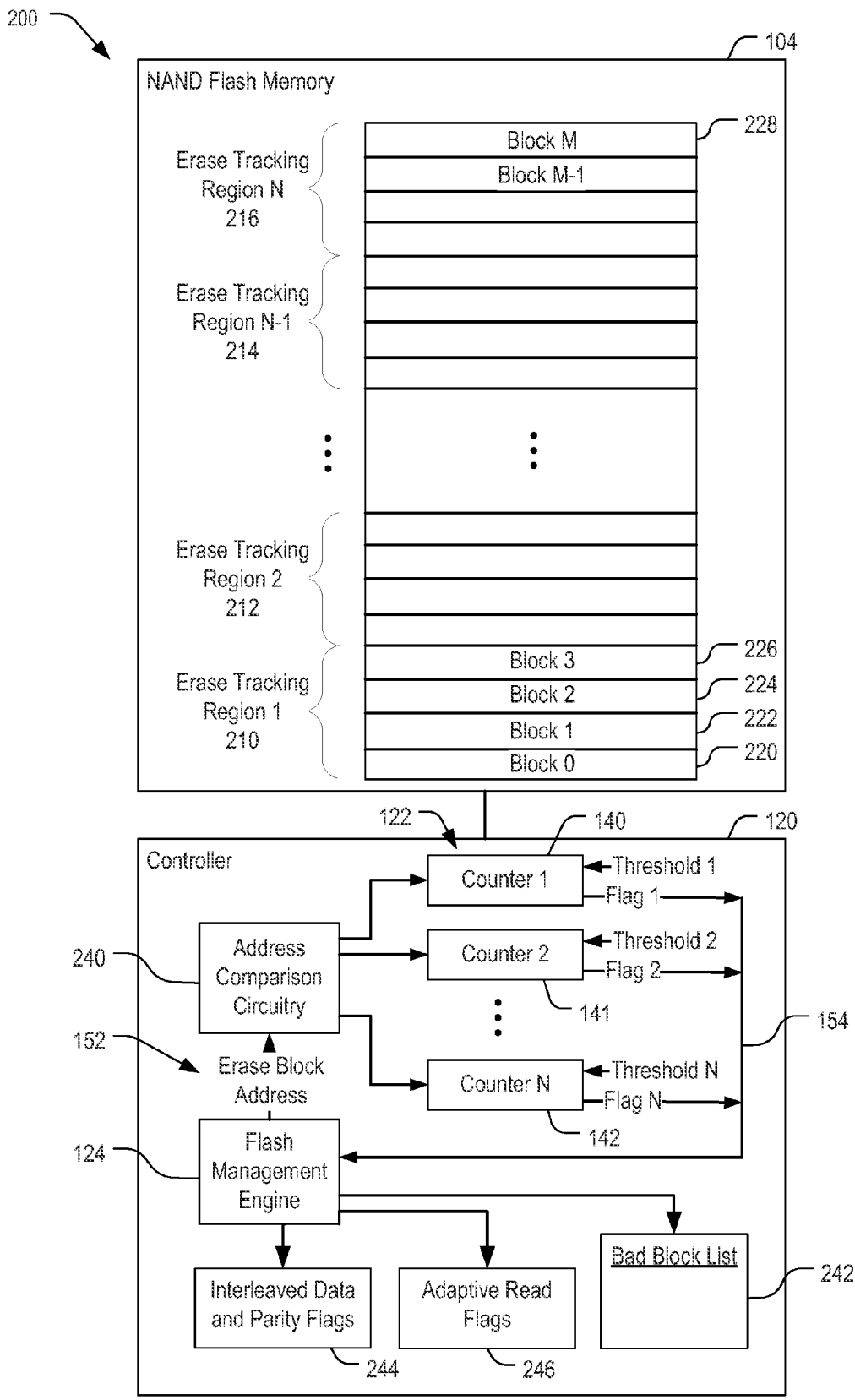
FIG. 2 is a block diagram illustrating a particular embodiment of components that may be incorporated in the data storage device of FIG. 1.

Because each region 110-112 may be determined according to W/E endurance characteristics, different thresholds may be used for different groups, as described with respect to FIG. 2. In other implementations, the single threshold 170 may be used for all of the regions 110-112 and an initial counter value of each of the groups may be adjusted according to characteristics of the groups. As a result, a group of erase blocks with higher W/E endurance may start with a lower initial counter value and may reach the threshold 170 after a greater number of W/E cycles than a group with lower W/E endurance that starts with a higher initial counter value.

The controller 120 may be configured to store counter values 180 to specific or dedicated portions of the non-volatile memory 104 for storage during power off conditions. For example, the controller 120 may be configured to store counter values 180 of the set of counters 122 to the non-volatile memory 104 during a session shutdown operation of the data storage device 102. Alternatively, or in addition, the controller 120 may be configured to perform periodic updates of the counter values 180 of the set of counters 122 to the non-volatile memory 104 during system operation. The controller 120 may further be configured to retrieve the stored counter values 180 from the non-volatile memory 104 and to initialize the counters 140-142 of the set of counters 122 according to the stored counter values 180 during a session initialization operation of the data storage device 102. To illustrate, the counter values 180 may include a table or other data structure that indicates a number of the regions 110-112 (e.g., N regions). For each region, the counter values 180 may include a value of a corresponding counter (e.g., the first value 160) for the first region 110, an address range corresponding to the particular region (e.g., addresses of a first and last erase block within the first region 110), and a value of the threshold 170 corresponding to the particular region. For example, a number and arrangement of the regions 110-112 may be modified over the life of the data storage device 102. In addition, different regions may correspond to different thresholds.

During operation, the memory management engine 124 may identify an erase block to be erased and may provide the erase block address 152 to the set of erase counters 122. In addition, the controller 120 may issue the erase command 150 to the non-volatile memory 104, such as concurrently with providing the erase block address 152 to the set of erase counters 122.

The controller 120 may determine a particular counter of the set of counters 122 that tracks the region of the non-volatile memory 104 corresponding to the erase block address 152. For example, the erase block address 152 may correspond to an erase block in the first region 110, which may be tracked by the first counter 140. In response to receiving the erase block address 152, a determination may be made that the erase block address 152 corresponds to the first counter 140, and the first counter 140 may update the first value 160 to indicate an additional erase operation has been or is being performed within the first region 110.

In response to the first value 160 (upon being updated by the first counter 140) satisfying the threshold 170, a corresponding flag 154 may be provided to the memory management engine 124. In response to receiving the flag 154, the memory management engine 124 may initiate the remedial action 126, such as scheduling one or more erase blocks to be unused or to be used in conjunction with one or more higher reliability techniques, such as described in further detail with respect to FIG. 2.

By tracking counts of erase operations to different regions of the non-volatile memory 104, and by initiating the remedial action 126 in response to a count of erase operations to a particular region 110-112 satisfying the threshold 170, data loss due to cumulative effects of W/E cycling occurring in the particular region 110-112 may be avoided. As a result, a number of errors occurring in the stored data due to W/E cycling may be maintained at a correctable level. The set of counters 122 and corresponding logic to map the set of counters 122 to individual regions of the non-volatile memory 104 may be implemented in dedicated circuitry to reduce latency and processing impact on the controller 120 during the erase operation, as described in further detail with respect to FIG. 2. Alternatively, the set of erase counters 122 may be implemented via one or more software processes executed by a processer within the controller 120, or by a combination of software executed by a processor and dedicated circuitry.

Referring to FIG. 2, a particular embodiment of the data storage device 102 of FIG. 1 is illustrated and generally designated 200. The non-volatile memory 104 is illustrated as a NAND flash memory that includes multiple erase blocks, including block 0 220, block 1 222, block 2 224, block 3 226, and additional blocks up to an Mth block (block M) 228. The NAND flash memory 104 is logically partitioned into multiple erase tracking regions, illustrated as a first erase tracking region 210, a second erase tracking region 212, and additional regions up to an N−1st erase tracking region 214 and an Nth erase tracking region 216. The controller 120 includes the set of counters 122 including the first counter 140, a second counter 141, and one or more other counters including the Nth counter 142. The controller 120 includes address comparison circuitry 240 that is coupled to receive the erase block address 152 from the flash management engine 124 and to generate an output signal to a counter that tracks a region 210-216 of the NAND flash memory 104 corresponding to the erase block address 152. The controller 120 further includes one or more interleaved data and parity flags 244, one or more adaptive read flags 246, and a bad block list 242.

The controller 120 is configured to provide the erase block address 152 from the flash management engine 124 to the address comparison circuitry 240. The address comparison circuitry 240 may be programmable to route particular erase block addresses 152 to particular counters of the set of counters 122. For example, the address comparison circuitry 240 may determine whether the erase block address 152 is within a first address range corresponding to the first erase tracking region 210, a second address range corresponding to the second erase tracking region 212, etc., and may generate an output signal to a corresponding one of the counters 140-142 to cause the counter to update its counter value.

Each of the counters 140-142 may be responsive to a corresponding threshold, illustrated as threshold 1, threshold 2, . . . threshold N. For example, each counter 140-142 may be configured to perform comparisons of the counter's value to its corresponding threshold and to generate a flag signal in response to the value satisfying the threshold. To illustrate, when the first counter 140 updates its counter value to an amount that matches the first threshold (threshold 1), the first counter 140 may generate a first flag indication (Flag 1) that may be provided to the flash management engine 124 as the flag 154. Each of the counters 140-142 may have a programmable threshold value such that each of the thresholds may have a distinct value, or one or more (or all) of the counters 140-142 may use a same threshold value.

Each of the counters 140-142 may provide a distinct flag signal to the flash management engine 124. For example, the flag indicator 154 may be a multi-bit signal, such as an interrupt signal with each bit of the interrupt signal corresponding to a distinct counter of the set of counters 122. In this manner, the flash management engine 124 may determine a particular erase tracking region 210-216 that has a count of erase operations satisfying its corresponding threshold. In response, the flash management engine 124 may perform the remedial action 126 of FIG. 1 to the blocks of the first erase tracking region 210.

An example of the remedial action 126 of FIG. 1 includes adding addresses of the blocks of the corresponding region, such as blocks 0-3 220-226 of the first erase tracking region 210, to the bad block list 242. The flash management engine 124 may be configured to perform data move operations to transfer data from blocks scheduled to be added to the bad block list 242, such as by copying the data to one or more spare blocks that may be available in the non-volatile memory 104. The flash management engine 124 may be configured to prevent usage of erase blocks that have been added to the bad block list 242.

As another example of the remedial action 126, instead of adding erase blocks to the bad block list 242, the flash management engine 124 may be configured to set one or more of the interleaved data and parity flags 244 to indicate that one or more erase blocks store data according to an interleaved configuration. To illustrate, because reading a single logical page of a physical page requires fewer sense operations than reading all logical pages of the physical page, ECC codewords may be stored on individual logical pages to be readable using a reduced number of sense operations. However, different logical pages of a single physical page may have different reliability. As a result, as an erase block is subjected to a number of W/E cycles approaching its threshold, an ECC codeword stored on a less reliable logical page is more likely to encounter an uncorrectable number of errors than an ECC codeword stored on a more reliable logical page. By interleaving multiple ECC codewords across multiple logical pages, errors occurring on the less-reliable logical page as well as errors occurring on the more-reliable logical page are shared among multiple ECC codewords, reducing the probability that any of the ECC codewords encounters an uncorrectable number of errors. The interleaved data and parity flags 244 may include a flag for each region 210-216 or for each erase block 220-228 in the non-volatile memory 104, and a value of each flag may be set to indicate whether the associated region or block uses a page-by-page data and parity configuration or an interleaved data and parity configuration.

The flash management engine 124 may be configured to set one or more of the adaptive read flags 246 to indicate that one or more erase blocks are to be read using an adaptive read technique. To illustrate, a set of read voltages may correspond to boundaries between states of storage elements and may be used during sensing operations to determine a state of storage elements of a word line in an erase block. However, as W/E cycling increases, shifting of threshold voltages of storage elements may cause the boundaries between the states to shift from the read voltages. Adaptive read techniques may include performing multiple reads of an ECC codeword from an erase block and varying one or more of the read voltages. Data resulting from each read may be provided to an ECC decoder to identify a corresponding number of errors detected in the data to identify values of the read voltages that result in a reduced number of errors. A set of read voltages that is identified as resulting in reduced errors may be selected for reading the data, resulting in a more accurate representation of the data as compared to using default values of the read voltages.

A mapping of regions to counters and a logical partitioning of the non-volatile memory 104 into the regions 110-112 may be stored as an initial configuration of the memory device 102 of FIG. 1 and may be set according to an initial set of programmable values, such as determined by a manufacturer of the data storage device 102. Although FIGS. 1 and 2 illustrate multiple regions having substantially equal size and that are substantially evenly distributed throughout the non-volatile memory 104, it should be understood that in other implementations one or more of the memory regions may have a size differing from others of the memory regions. As an example, effects of W/E cycling on stored data in the non-volatile memory 104 may be dependent on one or more factors such as a location in a memory array (e.g., at an edge of the array as compared to at an interior of the array), a particular plane of multi-plane memory, a particular die of a multi-die memory, one or more other factors such as a type of data stored, a ratio of '0' values to '1' values in stored data at the non-volatile memory 104, or other factors. Sizes of memory regions and groups of blocks in each region may be determined according to one or more such factors.

Because partitioning of the non-volatile memory 104 into multiple regions and a mapping of regions to counters may be programmable, the data storage device 102 may be configured to accommodate various factors and various differences in effects of W/E cycling on various portions of the non-volatile memory 104. For example, an initial logical partitioning and mapping of regions to the counters 140-142 may be set by a manufacturer of the data storage device 102 of FIG. 1. To illustrate, regions 110-112 of the non-volatile memory 104 may be set based on results of testing portions of the non-volatile memory 104 for susceptibility to W/E cycling effects, based on types of data stored to regions of the non-volatile memory 104, such as file management data or pre-loaded content, based on one or more other criteria, or any combination thereof. The memory management engine 124 may be configured to update the logical partitioning of the non-volatile memory 104 and a corresponding mapping of regions to counters according to one or more criteria, such as according to a history of erase operations to different portions of the non-volatile memory 104.

Figure 3:
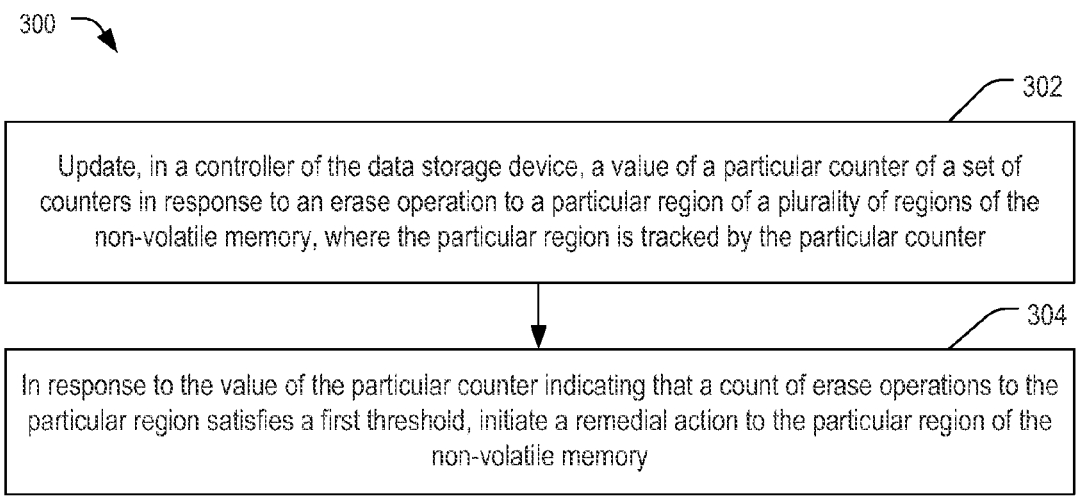
FIG. 3 is a flow chart of a particular illustrative embodiment of a method of tracking erase operations to regions of a non-volatile memory.

Referring to FIG. 3, a particular embodiment of a method 300 is depicted. The method 300 may be performed in a data storage device that includes a controller and a non-volatile memory, such as a flash memory. For example, the method 300 may be performed by the data storage device 102 of FIG. 1.

The method includes updating, in a controller of the data storage device, a value of a particular counter of a set of counters in response to an erase operation to a particular region of the non-volatile memory that is tracked by the particular counter, at 302. Erase operations to a first region of the non-volatile memory are tracked by a first counter of the set of counters, and erase operations to a second region of the non-volatile memory are tracked by a second counter of the set of counters. For example, erase operations to the first region 110 of FIG. 1 may be tracked by the first counter 140, and erase operations to the Nth region 112 of FIG. 1 may be tracked by the Nth counter 142.

In response to the value of the particular counter indicating that a count of erase operations to the particular region satisfies a first threshold, a remedial action to the particular region of the non-volatile memory is initiated, at 304. For example, the remedial action may be the remedial action 126 initiated by the memory management engine 124 of FIG. 1 and may include scheduling one or more erase blocks for non-use, flagging one or more erase blocks for data and parity interleaving, and/or flagging one or more erase blocks for adaptive read.

The method 300 may also include, during a session shutdown operation of the data storage device, storing values of the set of counters to the non-volatile memory. During a session initialization operation of the data storage device, stored counter values may be retrieved from the non-volatile memory and counters of the set of counters may be initialized according to the stored counter values. For example, the controller 120 may store the counter values 180 of FIG. 1 to the non-volatile memory 104 prior to powering down and may retrieve the counter values 180 from the non-volatile memory 104 during an initialization/powering up event.

The first region may correspond to a first set of erase blocks of the non-volatile memory, and the second region may correspond to a second set of erase blocks of the non-volatile memory. As one example, the first set of erase blocks may include a single erase block and the second set of erase blocks may include another single erase block. As a second example, the first set of erase blocks may include a contiguous group of erase blocks, such as the first erase tracking region 210 of FIG. 2 that includes a contiguous group of four erase blocks 220-226. As a third example, the first set of erase blocks may include a non-contiguous group of erase blocks. To illustrate, the first set of erase blocks may include blocks that have similar physical characteristics but that may not be adjacent to each other. For example, block 0 220 and block M 228 of FIG. 2 may have common physical characteristics due to being at edges of the NAND flash memory 104. The non-volatile memory may be logically partitioned into a programmable number of regions, and a count of erase operations to each of the multiple regions may tracked by a respective counter of the set of counters.

Initiating the remedial action may include scheduling an erase block associated with the particular counter to be unused, such as by scheduling the erase block to be added to the bad block list 242 of FIG. 2 after copying data from the erase block to another block of the non-volatile memory 104. Alternatively or in addition, initiating the remedial action may include setting a flag (e.g., the interleaved data and parity flags 244 of FIG. 2) to indicate data and parity interleaving is to be applied to the particular region. Alternatively or in addition, initiating the remedial action may include setting a flag (e.g., the adaptive read flags 244 of FIG. 2) to indicate adaptive reading is to be applied to the particular region.

Although various components depicted herein are illustrated as block components and described in general terms, such components may include one or more microprocessors, state machines, or other circuits configured to enable the controller 120 of FIG. 1 to initiate the remedial action based on comparisons of the counter values 160-162 to one or more threshold(s) 170. For example, the controller 120 may represent physical components, such as hardware controllers, state machines, logic circuits, or other structures, to enable the controller 120 of FIG. 1 to track erase operations to individual regions 110-112 and to initiate one or more remedial actions to individual regions 110-112.

The controller 120 may be implemented using a microprocessor or microcontroller programmed to update counters in response to erase operations to corresponding regions of the non-volatile memory 104, and upon determining that a counter value indicates that a number of erase operations to a particular region satisfies a threshold amount, to initiate a remedial action, such as by scheduling one or more erase blocks for non-use or setting one or more of the interleaved data and parity flags 244 and/or the adaptive read flags 246. In a particular embodiment, the controller 120 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a controller and a non-volatile memory, performing:
      updating a value of a particular counter of a set of counters in response to an erase operation to a particular region of a plurality of regions of the non-volatile memory, wherein the particular region is tracked by the particular counter; and
      in response to the value of the particular counter indicating that a count of erase operations to the particular region satisfies a first threshold, causing data and parity to be interleaved across multiple logical pages of the particular region during a write operation.

2. The method of claim 1, wherein erase operations to a first region of the non-volatile memory are tracked by a first counter of the set of counters, wherein erase operations to a second region of the non-volatile memory are tracked by a second counter of the set of counters, wherein the first region corresponds to a first set of erase blocks of the non-volatile memory, and wherein the second region corresponds to a second set of erase blocks of the non-volatile memory.

3. The method of claim 2, wherein the first set of erase blocks comprises a single erase block and wherein the second set of erase blocks comprises another single erase block.

4. The method of claim 2, wherein the first set of erase blocks includes a contiguous group of erase blocks.

5. The method of claim 2, wherein the first set of erase blocks includes a non-contiguous group of erase blocks.

6. The method of claim 1, further comprising, based on the value of the particular counter, causing an erase block in the particular region to be indicated as unused.

7. The method of claim 1, wherein causing the data and parity to be interleaved across multiple logical pages of the particular region includes setting a value of a multi-bit flag indicator, wherein each bit of the multi-bit flag indicator corresponds to a distinct counter of the set of counters.

8. The method of claim 1, further comprising, based on the value of the particular counter, causing adaptive reading to be applied to the particular region during a read operation.

9. The method of claim 1, further comprising, during a session shut-down operation of the data storage device, storing values of the set of counters to the non-volatile memory as stored counter values, and during a session initialization operation of the data storage device, retrieving the stored counter values from the non-volatile memory and initializing counters of the set of counters according to the stored counter values.

10. The method of claim 1, wherein the non-volatile memory is logically partitioned into a programmable number of regions and wherein a count of erase operations to each of the plurality of regions is tracked by a respective counter of the set of counters.

11. The method of claim 1, wherein the non-volatile memory includes a flash memory.

12. A data storage device comprising:
a non-volatile memory; and
a controller configured to update a value of a particular counter of a set of counters in response to an erase operation to a particular region of a plurality of regions of the non-volatile memory, wherein the particular region is tracked by the particular counter, and
wherein, in response to the value of the particular counter indicating that a count of erase operations to the particular region satisfies a first threshold, the controller is configured to cause an adaptive read process using multiple sets of read voltages to be used during a read operation of the particular region.

13. The data storage device of claim 12, wherein erase operations to a first region of the non-volatile memory are tracked by a first counter of the set of counters, wherein erase operations to a second region of the non-volatile memory are tracked by a second counter of the set of counters, wherein the first region corresponds to a first set of erase blocks of the non-volatile memory, and wherein the second region corresponds to a second set of erase blocks of the non-volatile memory.

14. The data storage device of claim 13, wherein the first set of erase blocks comprises a single erase block and wherein the second set of erase blocks comprises another single erase block.

15. The data storage device of claim 13, wherein the first set of erase blocks includes a contiguous group of erase blocks.

16. The data storage device of claim 13, wherein the first set of erase blocks includes a non-contiguous group of erase blocks.

17. The data storage device of claim 12, wherein the controller is configured to, based on the value of the particular counter, cause an erase block in the particular region to be indicated as unused.

18. The data storage device of claim 12, wherein the controller is configured to, based on the value of the particular counter, cause data and parity interleaving to be applied to the particular region during a write operation.

19. The data storage device of claim 12, wherein the controller causes the adaptive read process to be used by setting a value of a multi-bit flag indicator, wherein each bit of the multi-bit flag indicator corresponds to a distinct counter of the set of counters.

20. The data storage device of claim 12, wherein the controller is configured to store values of the set of counters to the non-volatile memory during a session shut-down operation and to retrieve stored counter values from the non-volatile memory and initialize counters of the set of counters according to the stored counter values during a session initialization operation.

21. The data storage device of claim 12, wherein the controller is configured to perform periodic updates of values of the set of counters to the non-volatile memory.

22. The data storage device of claim 12, wherein the non-volatile memory is logically partitioned into a programmable number of regions and wherein a count of erase operations to each of the plurality of regions is tracked by a respective counter of the set of counters.

23. The data storage device of claim 12, wherein the non-volatile memory includes a flash memory.

24. A method comprising:
in a data storage device that includes a controller and a non-volatile memory, performing:
updating a value of a particular counter of a set of counters in response to an erase operation to a particular region of a plurality of regions of the non-volatile memory, wherein the particular region is tracked by the particular counter;
in response to the value of the particular counter indicating that a count of erase operations to the particular region satisfies a threshold, setting a value of a multi-bit flag indication, wherein each bit of the multi-bit flag indication corresponds to a different region of the plurality of regions; and
providing the multi-bit flag indication to a memory management engine, wherein, based on the value of the multi-bit flag indication, the memory management engine causes an enhanced reliability technique to be used to read data from or write data to the particular region.

25. The method of claim 24, wherein the multi-bit flag indication is provided to the memory management engine via an interrupt signal.

* * * * *